(12) United States Patent
Yuasa et al.

(10) Patent No.: US 11,640,895 B2
(45) Date of Patent: May 2, 2023

(54) SAMPLE HOLDER AND CHARGED PARTICLE BEAM SYSTEM

(71) Applicant: JEOL Ltd., Tokyo (JP)

(72) Inventors: Shuichi Yuasa, Tokyo (JP); Takahisa Kawamura, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/570,719

(22) Filed: Jan. 7, 2022

(65) Prior Publication Data

US 2022/0223368 A1 Jul. 14, 2022

(30) Foreign Application Priority Data

Jan. 8, 2021 (JP) .............................. JP2021-002168

(51) Int. Cl.
*H01J 37/20* (2006.01)
*H01J 37/18* (2006.01)

(52) U.S. Cl.
CPC ............ *H01J 37/185* (2013.01); *H01J 37/20* (2013.01)

(58) Field of Classification Search
CPC ........ H01J 37/20; H01J 37/185; H01J 37/317; H01J 37/3056; H01J 2237/184; H01J 2237/204; H01J 2237/2007; H01J 2237/20207; H01J 2237/20214; H01J 2237/20242; H01J 2237/31745

See application file for complete search history.

(56) References Cited

U.S. PATENT DOCUMENTS

| 6,818,560 | B1 | 11/2004 | Koshimizu et al. |
| 2006/0022135 | A1 | 2/2006 | Moore et al. |
| 2015/0137000 | A1 | 5/2015 | Naruse |
| 2017/0133197 | A1 | 5/2017 | Kawai |
| 2018/0286628 | A1* | 10/2018 | Hasuda ............... H01J 37/3056 |

FOREIGN PATENT DOCUMENTS

| EP | 3038131 A1 | 6/2016 |
| JP | H0817381 A | 1/1996 |
| JP | H11185686 A | 7/1999 |
| JP | 2002365182 A | 12/2002 |

(Continued)

OTHER PUBLICATIONS

Office Action issued in JP2021002167 dated Dec. 20, 2022.
(Continued)

*Primary Examiner* — David E Smith
*Assistant Examiner* — Hsien C Tsai
(74) *Attorney, Agent, or Firm* — The Webb Law Firm

(57) ABSTRACT

There is provided a sample holder capable of reducing positional deviation of a cartridge in the heightwise direction of a sample. The sample holder includes the cartridge and a holder base having a mounting portion for the cartridge. The mounting portion includes a placement surface, a first tilted surface, and a rotary drive mechanism for imparting a rotary force to the cartridge. The cartridge includes an opposing first tilted surface opposite to the first tilted surface of the mounting portion. As the rotary drive mechanism imparts the rotary force to the cartridge, the first tilted surface of the cartridge is pressed against the first tilted surface of the mounting portion, whereby the cartridge is pressed against the placement surface.

9 Claims, 4 Drawing Sheets

(56) References Cited

FOREIGN PATENT DOCUMENTS

JP          201588237 A    5/2015
KR     1020010039900 A    5/2001

OTHER PUBLICATIONS

Office Action issued in JP2021002165 dated Dec. 20, 2022.
Extended European Search Report issued in EP21217690.3 dated May 30, 2022.
Notice of Allowance And Fee(s) Due issued in U.S. Appl. No. 17/570,749 dated Feb. 2, 2023.

* cited by examiner

US 11,640,895 B2

SAMPLE HOLDER AND CHARGED PARTICLE BEAM SYSTEM

CROSS-REFERENCE TO RELATED APPLICATION

This application claims priority to Japanese Patent Application No. 2021-002168, filed Jan. 8, 2021, the disclosure of which is hereby incorporated by reference in its entirety.

BACKGROUND OF THE INVENTION

1. Field of the Invention

The present invention relates to a sample holder and a charged particle beam system.

2. Description of the Related Art

In the field of charged particle beam systems including transmission electron microscopes, a cartridge type sample holder is known. In this sample holder, a cartridge in which a sample is held can be detachably mounted on a holder base.

For example, JP-A-8-17381 discloses a sample holder equipped with an insertion hole into/from which a cartridge can be inserted and removed. In this sample holder, the cartridge is supported in a cantilevered manner.

With this sample holder for use in a charged particle beam system, when a sample stage for the cartridge is tilted, the cartridge may sometimes deviate in the heightwise direction of the sample, in which case defocusing will occur.

SUMMARY OF THE INVENTION

One aspect of the sample holder associated with the present invention is a sample holder which is for use in a charged particle beam system and which includes: a cartridge for holding a sample therein; and a holder base having a mounting portion to which the cartridge can be detachably mounted. The mounting portion of the holder base includes: a cartridge placement surface on which the cartridge is placed; a first tilted surface; and a rotary drive mechanism for imparting a rotary force to the cartridge. The cartridge includes an opposing first tilted surface opposite to the first tilted surface of the mounting portion of the holder base. As the rotary drive mechanism imparts a rotary force to the cartridge, the opposing first tilted surface of the cartridge is pushed against the first tilted surface of the mounting portion, whereby the cartridge is pushed against the cartridge placement surface of the mounting portion of the holder base.

In this sample holder, the cartridge is pushed against the cartridge placement surface of the mounting portion and so the cartridge can be brought into intimate contact with the placement surface. Consequently, in this sample holder, positional deviation of the cartridge in the heightwise direction of the sample can be reduced.

One aspect of the charged particle beam system associated with the present invention includes the sample holder described just above.

Because this charged particle beam system includes the above-described sample holder, positional deviation of the cartridge in the heightwise direction of the sample can be reduced. Consequently, in this charged particle beam system, if the sample deviates in position in the heightwise direction, there occurs a smaller amount of defocus than in the prior art.

DESCRIPTION OF THE INVENTION

The preferred embodiments of the present invention are hereinafter described in detail with reference to the accompanying drawings. It is to be understood that the embodiments provided below are not intended to unduly restrict the contents of the present invention delineated by the claims and that not all the configurations set forth below are the essential constituent components of the invention.

1. Sample Holder

Figure 1:
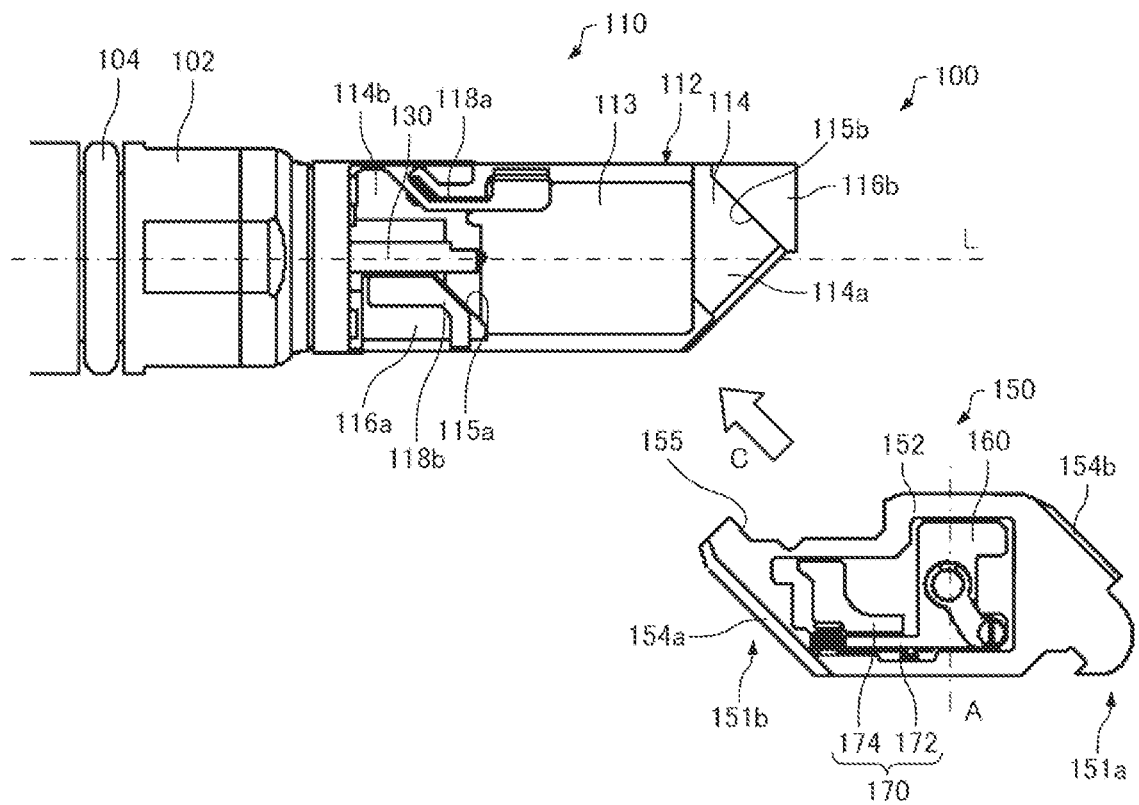
FIGS. 1 and 2 are schematic plan views of a sample holder associated with one embodiment of the present invention, illustrating different operational states.
Figure 2:
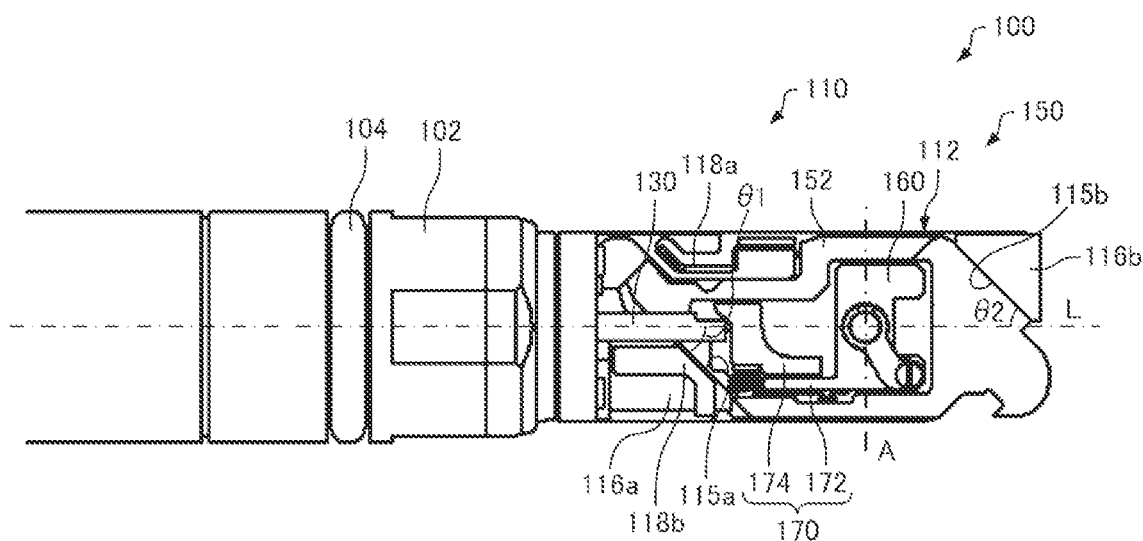

A sample holder associated with one embodiment of the present invention is first described by referring to FIGS. 1 and 2, which are schematic plan views of the sample holder, 100. FIG. 1 shows a state in which a cartridge 150 has been detached from a mounting portion 112 of a holder base 110. FIG. 2 shows a state in which the cartridge 150 has been mounted to the mounting portion 112 of the holder base 110. The sample holder 100 is for use in a transmission electron microscope and includes the holder base 110 and the cartridge 150, as shown. The holder base 110 has a shaft portion 102 and the mounting portion 112. The shaft portion 102 is a rodlike member and constitutes a hand grip of the sample holder 100. An O-ring 104 is mounted on the shaft portion 102. In particular, the shaft portion 102 has an outer peripheral surface provided with a groove in which the O-ring 104 is mounted. When the sample holder 100 is inserted into the electron microscope, the sample chamber can be made airtight by virtue of the O-ring 104. The shaft portion 102 has a grip portion (not shown) at its rear end to permit a user to grip the sample holder 100.

The mounting portion 112 of the holder base 110 is formed at the front end of the shaft portion 102 and designed such that the cartridge 150 can be mounted thereto. The mounting portion 112 has a placement surface 114 on which the cartridge 150 is to be placed. Furthermore, the mounting portion 112 includes a first block 116*a* having a first tilted surface 115*a*, a second block 116*b* having a second tilted surface 115*b*, a first resilient member 118*a*, and a second resilient member 118*b*.

The placement surface 114 of the mounting portion 112 of the holder base 110 provides a surface on which the cartridge 150 is to be placed. The placement surface 114 is provided with an opening 113 at a position that overlaps with a sample stage 160, a tilt arm 172, and a tilt lever 174. The placement surface 114 has a first region 114a providing support of a front end portion 151a of the cartridge 150 and a second region 114b providing support of a rear end portion 151b of the cartridge 150 and thus the mounting portion 112 can support both front end portion 151a and rear end portion 151b of the cartridge 150.

The first block 116a is mounted at the rear end of the mounting portion 112 and has the first tilted surface 115a that is tilted relative to the placement surface 114. The first tilted surface 115a faces obliquely downwards. The first tilted surface 115a and the central axis L of the shaft portion 102 form an angle θ1 (where 0°<θ1<90°) in planar view, i.e., as viewed from a direction parallel to a line normal to the placement surface 114. The first tilted surface 115a is tilted relative to the central axis L in planar view.

The second block 116b is mounted at the front end of the mounting portion 112 and has the second tilted surface 115b which is tilted relative to the placement surface 114 and which faces obliquely downwards. As viewed within a plane, the second tilted surface 115b and the central axis L of the shaft portion 102 form an angle θ2, where 0°<θ2<90°, and the second tilted surface 115b is tilted relative to the central axis L in planar view. As an example, the angles θ1 and θ2 are equal to each other.

The first resilient member 118a and the second resilient member 118b together function as a rotary drive mechanism for imparting a rotary force to the cartridge 150. In particular, the rotary force imparted by the resilient members 118a, 118b acts about an axis of rotation parallel to the normal to the placement surface 114.

As a side surface 155 of the cartridge 150 pushes on the first resilient member 118a, it elastically deforms and pushes back the side surface 155. Consequently, a rotary force is imparted to the cartridge 150. The first resilient member 118a is a leaf spring, for example. Alternatively, the first resilient member 118a may be made of a coil spring, rubber, or other material.

Figure 3:
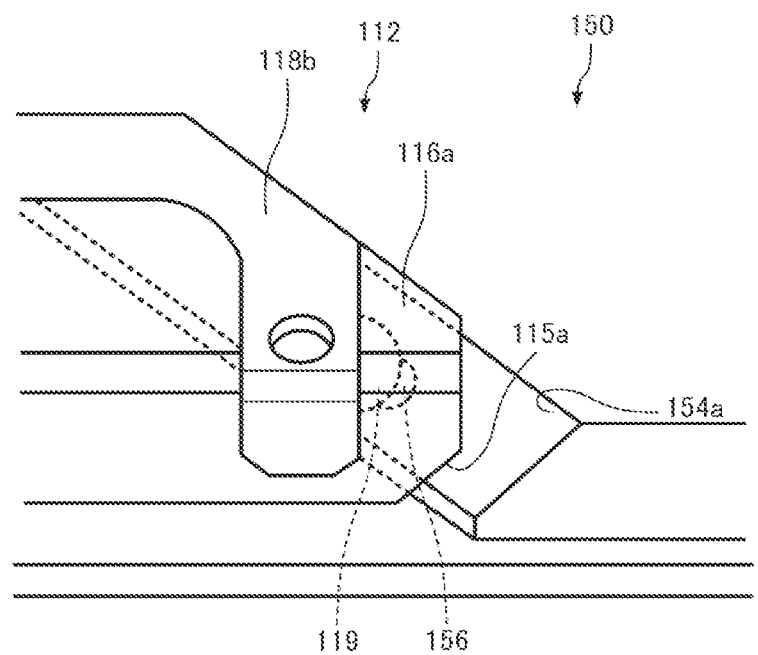
FIG. 3 is a schematic perspective view of a part of the sample holder of FIGS. 1 and 2.

FIG. 3 is a schematic perspective view of a part of the sample holder 100. Balls 119 are fastened to the second resilient member 118b as shown. The balls 119 are ruby balls, for example. When an opposing first tilted surface 154a of the cartridge 150 is pushed against the second resilient member 118b via the balls 119, the second resilient member 118 elastically deforms and pushes back the opposing first tilted surface 154a. Consequently, a rotary force is imparted to the cartridge 150. The second resilient member 118b is a leaf spring, for example. Alternatively, the second resilient member 118b may be made of a coil spring, rubber, or other material.

When the cartridge 150 is mounted to the mounting portion 112, the balls 119 fit in holes 156 formed in the opposing first tilted surface 154a, thus limiting movement of the cartridge 150.

As shown in FIG. 2, the cartridge 150 is disposed between the first block 116a and the second block 116b, i.e., between the first tilted surface 115a and the second tilted surface 115b. The first block 116a and the second block 116b together function as a guide means for guiding the cartridge 150 when it is mounted to the mounting portion 112.

The holder base 110 has a shaft 130 for actuating a tilt mechanism 170 for the cartridge 150. The shaft 130 is coupled to a drive source such as an electric motor via a feed screw mounted inside the shaft portion 102 in a manner not illustrated.

As shown in FIG. 1, the cartridge 150 is mounted to the mounting portion 112 from a direction C at an angle to the central axis L of the shaft portion 102. In particular, by moving the cartridge 150 in the oblique direction C while the mounting portion 112 is at rest, the cartridge 150 is inserted and secured into the mounting portion 112.

The cartridge 150 holds the sample therein and has a frame 152, the sample stage 160, and the tilt mechanism 170. The sample stage 160 holds the sample. The sample stage 160 is provided with a through hole over which the sample is held. The sample is secured to the sample stage 160, using a C-ring or leaf spring, for example.

The sample stage 160 is connected to the frame 152 of the cartridge 150 with a shaft member (not shown) which supports the sample stage 160 such that the stage 160 can rotate about an axis A and so the sample stage 160 can tilt about the axis A. In the illustrated example, the axis A and the central axis L of the shaft portion 102 form an angle of 90° with respect to each other as viewed within a plane.

The frame 152 is a rodlike member and surrounds the sample stage 160 and the tilt mechanism 170. The frame 152 has an opposing second tilted surface 154b as well as the opposing first tilted surface 154a. The first tilted surface 154a is formed in a rear end portion 151b of the cartridge 150 and tilted relative to the bottom surface of the cartridge 150. The opposing first tilted surface 154a faces obliquely upwardly. The opposing second tilted surface 154b is formed in the front end portion 151a of the cartridge 150 and tilted relative to the bottom surface of the cartridge 150. The opposing second tilted surface 154b faces obliquely upwardly.

When the cartridge 150 is mounted to the mounting portion 112, the opposing first tilted surface 154a and the opposing second tilted surface 154b of the cartridge 150 are placed in opposition to the first tilted surface 115a and the second tilted surface 115b, respectively, of the mounting portion 112.

The tilt mechanism 170 has the tilt arm 172 and the tilt lever 174. The tilt arm 172 is connected to the sample stage 160 and also to the tilt lever 174. When the cartridge 150 is mounted to the mounting portion 112, the front end of the shaft 130 is in contact with the tilt lever 174. As the shaft 130 elongates and contracts, the tilt lever 174 rotates, tilting the sample stage 160 connected to the tilt arm 172 about the axis A.

2. Operation

Figure 4:
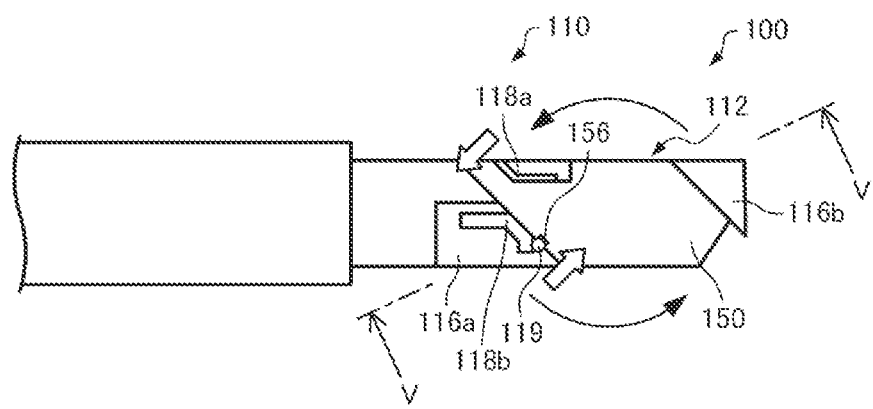
FIG. 4 is a simplified schematic of the sample holder of FIGS. 1 and 2, illustrating the operation of the holder.
Figure 5:
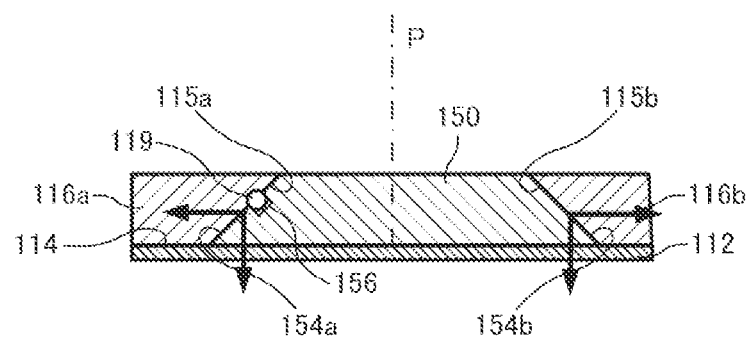
FIG. 5 is a simplified cross section of the sample holder of FIGS. 1 and 2, illustrating the operation of the holder.

FIGS. 4 and 5 illustrate the operation of the sample holder 100. FIG. 4 is a schematic plan view of the sample holder 100. FIG. 5 is a cross-sectional view taken on line V-V of FIG. 4. For the sake of convenience, members making up the sample holder 100 are shown in simplified form in FIGS. 4 and 5.

As shown in FIG. 5, the cartridge 150 assumes a wedge-shaped form by its opposing first tilted surface 154a and opposing second tilted surface 154b. That is, the cartridge 150 increases in width in going from its top surface toward its bottom surface. Similarly, a space defined by the first tilted surface 115a and second tilted surface 115b of the mounting portion 112 has a width which increases in going from above to below.

As shown in FIG. 1, the cartridge 150 is made to plunge into the mounting portion 112 from the state in which the cartridge 150 has been detached from the mounting portion 112. In particular, the cartridge 150 is moved in the oblique direction C relative to the central axis L of the shaft portion 102.

The cartridge 150 passes between the first block 116a and the second block 116b while guided by the first tilted surface 115a of the first block 116a and the second tilted surface 115b of the second block 116b. The cartridge 150 slides in the oblique direction C on the placement surface 114 of the mounting portion 112.

When the cartridge 150 is inserted into the mounting portion 112, the first resilient member 118a and the second resilient member 118b are pushed in by the cartridge 150. Specifically, the first resilient member 118a is pushed in by the side surface 155 of the cartridge 150, while the second resilient member 118b is pushed in by the opposing first tilted surface 154a. This causes elastic deformation of the first resilient member 118a and the second resilient member 118b, thus pushing back the cartridge 150. As a result, as shown in FIG. 4, a rotary force acting about an axis of rotation parallel to a line P normal to the placement surface 114 is imparted to the cartridge 150. In the example shown in FIG. 4, a counterclockwise rotary force is applied to the cartridge 150.

As a rotary force is applied to the cartridge 150, the opposing first tilted surface 154a and the opposing second tilted surface 154b of the cartridge 150 are pushed against the first tilted surface 115a and the second tilted surface 115b, respectively. As the opposing first tilted surface 154a of the cartridge 150 is pushed against the first tilted surface 115a of the first block 116a, a horizontal force and a downward force act on the cartridge 150. The downward force urges the rear end portion 151b of the cartridge 150 against the second region 114b of the placement surface 114, whereby the rear end portion 151b comes into intimate contact with the second region 114b.

Similarly, as the opposing second tilted surface 154b is pressed against the second tilted surface 115b, a horizontal force and a downward force act on the cartridge 150. The downward force urges the front end portion 151a of the cartridge 150 against the first region 114a of the placement surface 114, whereby the front end portion 151a comes into intimate contact with the first region 114a.

In this way, the opposing first tilted surface 154a and the opposing second tilted surface 154b are pushed against the first tilted surface 115a and the second tilted surface 115b, respectively, inducing a downward force on the cartridge 150. This pushes the cartridge 150 against the placement surface 114, bringing the cartridge 150 into intimate contact with the placement surface 114.

When the second resilient member 118b elastically deforms and pushes back the opposing first tilted surface 154a, the balls 119 secured to the second resilient member 118b fit into the holes 156 formed in the opposing first tilted surface 154a, thus restricting movement of the cartridge 150. In particular, a rotary force imparted to the cartridge 150 can prevent the cartridge 150 from coming off the mounting portion 112.

3. Functions and Effects

The sample holder 100 includes: the cartridge 150; and the holder base 110 having the mounting portion 112 to which the cartridge 150 can be removably mounted. The first resilient member 118a and the second resilient member 118b together impart a rotary force to the cartridge 150, thus pushing the opposing first tilted surface 154a against the first tilted surface 115a. This, in turn, forces the cartridge 150 against the placement surface 114 of the mounting portion 112.

In this way, in the sample holder 100, the cartridge 150 is pushed against the placement surface 114 of the mounting portion 112 and so the cartridge 150 can be brought into intimate contact with the placement surface 114. Accordingly, in the sample holder 100, positional deviation of the cartridge 150 in the heightwise direction of the sample (i.e., along the normal P to the placement surface 114 shown in FIG. 5) can be reduced.

In the sample holder 100, the cartridge 150 is disposed between the first tilted surface 115a and the second tilted surface 115b of the mounting portion 112. The first resilient member 118a and the second resilient member 118b together impart a rotary force to the cartridge 150, whereby the opposing first tilted surface 154a and the opposing second tilted surface 154b are pushed against the first tilted surface 115a and the second tilted surface 115b, respectively. As a consequence, the cartridge 150 is pushed against the placement surface 114 of the mounting portion 112.

As a result, the opposite ends of the cartridge 150 are pushed against the placement surface 114 of the mounting portion 112 and hence the cartridge 150 can be brought into more intimate contact with the placement surface 114 than where only one end of the cartridge 150 is pushed against the placement surface 114. Consequently, positional deviation of the cartridge 150 in the heightwise direction of the sample can be reduced further.

In the sample holder 100, the mounting portion 112 includes the second block 116b provided with the second tilted surface 115b, the second block 116b being located at the front end of the mounting portion 112. Therefore, in the sample holder 100, the front end portion 151a of the cartridge 150 can be secured. Consequently, positional deviation of the cartridge 150 in the heightwise direction of the sample can be reduced, for example, as compared with the case where the cartridge 150 is supported in a cantilevered manner and the front end portion 151a of the cartridge 150 is unsupported and free to move.

When the sample stage 160 is tilted, the tilt lever 174 is pushed and pulled by stretching and contracting the shaft 130. For example, where the cartridge 150 is supported in a cantilevered manner, the front end portion 151a of the cartridge 150 is unsupported and free to move. Therefore, if the shaft 130 is stretched and contracted to push and pull the tilt lever 174 in an attempt to tilt the sample stage 160, the front end portion 151a of the cartridge 150 flexes and unflexes, resulting in positional deviation of the cartridge 150 in the heightwise direction of the sample.

In the sample holder 100, the placement surface 114 has the first region 114a supporting the front end portion 151a of the cartridge 150 and the second region 114b supporting the rear end portion 151b of the cartridge 150. That is, in the sample holder 100, both ends of the cartridge 150 can be supported. Therefore, in the sample holder 100, positional deviation of the cartridge 150 in the heightwise direction of the sample can be reduced, for example, as compared with the case where the cartridge 150 is supported in a cantilevered manner.

In the sample holder 100, the first resilient member 118a and the second resilient member 118b together function as a rotary drive mechanism for imparting a rotary force to the cartridge 150, whereby a rotary force acting about an axis of rotation parallel to the normal P to the placement surface 114 is produced on the cartridge 150. Consequently, the opposing first tilted surface 154a and the opposing second tilted surface 154b can be pushed against the first tilted surface 115a and the second tilted surface 115b, respectively.

In the sample holder 100, the cartridge 150 is pushed against the first resilient member 118a and the second resilient member 118b and thus a rotary force is imparted to the cartridge 150. In the sample holder 100, therefore, a rotary force can be imparted to the cartridge 150 with a simple structure without using a drive source such as an electric motor.

In the sample holder 100, the balls 119 are secured to the second resilient member 118b. The holes 156 are formed in the first tilted surface 115a. The balls 119 fit in the holes 156, thus restricting movement of the cartridge 150. Therefore, in the sample holder 100, the cartridge 150 can be prevented from coming off the mounting portion 112.

4. Electron Microscope 4.1. Configuration of Electron Microscope

Figure 6:
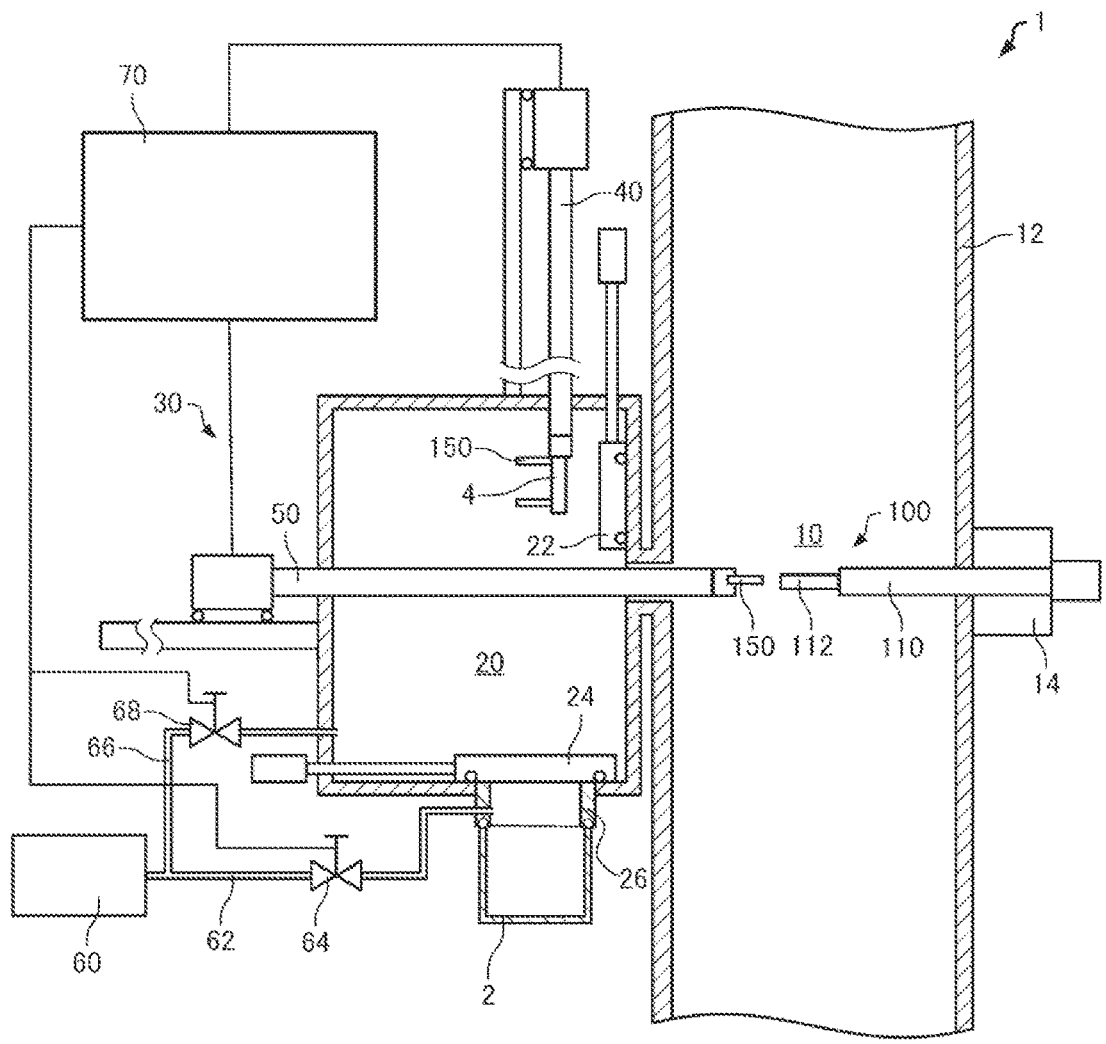
FIG. 6 is a diagram of an electron microscope including the sample holder of FIGS. 1 and 2, illustrating the configuration of the microscope.
Figure 7:
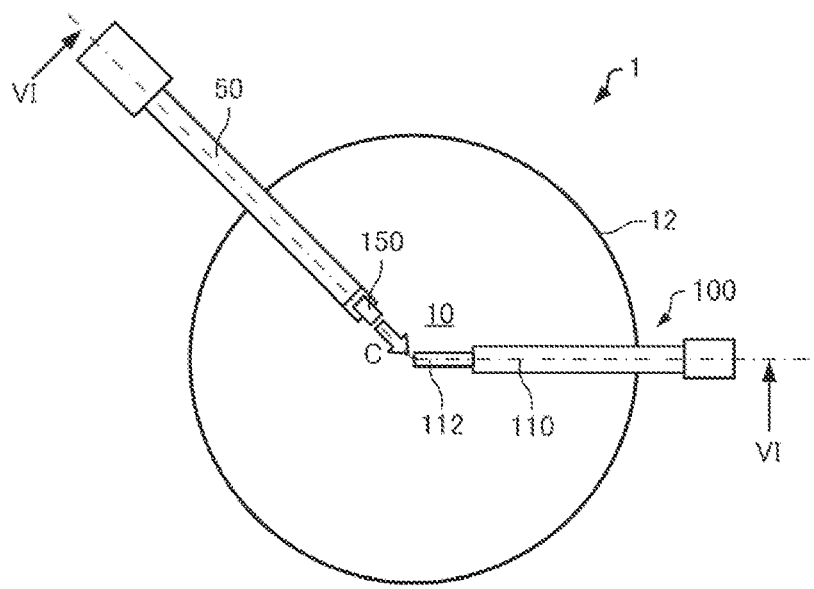
FIG. 7 is a diagram illustrating the configuration of the electron microscope of FIG. 6.

An electron microscope including the sample holder 100 is next described. FIGS. 6 and 7 illustrate the configuration of the electron microscope, generally indicated by reference numeral 1, which includes the sample holder 100. FIG. 6 is a cross-sectional view taken on line VI-VI of FIG. 7. In FIG. 7, only the sample holder 100, a second transport rod 50, and an electron optical column 12 are shown for the sake of convenience.

As shown in FIG. 6, the electron microscope 1 includes a sample chamber 10, a sample exchange chamber 20, a transport device 30, vacuum pumping equipment 60, and a controller 70, as well as the sample holder 100. The electron microscope 1 is a transmission electron microscope, for example.

The sample chamber 10 is an interior space of the electron optical column 12. An electron source for emitting an electron beam, an illumination optical system, and an imaging system (none of which are shown) are housed in the electron optical column 12. The electron beam emitted from the electron source is directed at a sample by the illumination optical system. The imaging system creates a focused TEM image from the electron beam transmitted through the sample. The electron microscope 1 is also equipped with a detector for detecting the image focused by the imaging system and a detector for detecting X-rays released from the sample in a manner not illustrated.

The sample chamber 10 is a space between top and bottom polepieces of an objective lens (not shown). The sample chamber 10 is evacuated to a vacuum by vacuum pumping equipment. The mounting portion 112 of the holder base 110 is disposed in the sample chamber 10. A sample held in the sample holder 100 is irradiated with the electron beam in the sample chamber 10. The sample holder 100 is placed in position by a goniometer stage 14.

The sample exchange chamber 20 is coupled to the sample chamber 10. A partition valve 22 is mounted between the sample exchange chamber 20 and the sample chamber 10. The sample container 2 can be attached to and detached from a connective member 26 mounted in the sample exchange chamber 20. Another partition valve 24 is mounted between the sample exchange chamber 20 and the sample container 2. A plurality of cartridges 150 are loaded in the magazine 4, which in turn can be received in the sample container 2. The sample exchange chamber 20 and the sample container 2 are evacuated to a vacuum by the vacuum pumping equipment 60.

The transport device 30 has a first transport rod 40 and a second transport rod 50. The first transport rod 40 carries each cartridge 150 between the sample container 2 and the sample exchange chamber 20. In this example, the first transport rod 40 carries the cartridge 150 by transporting the magazine 4. The first transport rod 40 grips the magazine 4 at its front end, moves the gripped magazine 4 upwardly, and carries the magazine 4 from the sample container 2 to the sample exchange chamber 20.

The second transport rod 50 carries the cartridge 150 between the sample exchange chamber 20 and the sample chamber 10. The second transport rod 50 takes out the cartridge 150 from within the magazine 4 gripped by the first transport rod 40, carries the extracted cartridge 150 from the sample exchange chamber 20 to the sample chamber 10, and mounts the cartridge to the mounting portion 112. The second transport rod 50 mounts the cartridge 150 to the mounting portion 112 by moving the cartridge 150 in the oblique direction C relative to the central axis L of the sample holder 100 as shown in FIG. 7.

The vacuum pumping equipment 60 evacuates the sample container 2 to a vacuum via an exhaust tube 62. A solenoid valve 64 is mounted in the exhaust tube 62. The vacuum pumping equipment 60 also evacuates the sample exchange chamber 20 to a vacuum via an exhaust tube 66. A solenoid valve 68 is mounted in the exhaust tube 66.

The controller 70 controls the partition valves 22, 24, transport device 30, and solenoid valves 64, 68. For example, the controller 70 includes a CPU (central processing unit) and storage devices such as a RAM (random access memory) and a ROM (read only memory). The controller 70 performs various kinds of control operations by executing programs stored in the storage devices with the CPU.

4.2. Operation 4.2.1. Mounting of Cartridge

In the electron microscope 1, the cartridge 150 received in the sample container 2 can be automatically transported into the sample chamber 10 and attached to the mounting portion 112 of the holder base 110.

The cartridge 150 loaded in the magazine 4 is received in the sample container 2, which in turn is mounted to the connective member 26. At this time, the partition valve 24 is closed. Then, the user enters an instruction to the controller 70 to introduce the cartridge 150.

Upon receiving the instruction for introducing the cartridge 150, the controller 70 opens the solenoid valve 64 and evacuates the interior of the sample container 2 to a vacuum. When the interior of the sample container 2 becomes below a given pressure, the controller 70 opens the partition valve 24.

The magazine 4 in the sample container 2 is gripped by the first transport rod 40 and transported into the sample exchange chamber 20 under control of the controller 70. Then, the partition valve 24 is closed while the partition valve 22 is opened, also under control of the controller 70.

The second transport rod 50 grips the specified cartridge 150 from within the magazine 4 gripped by the first transport rod 40 and the cartridge 150 is transported into the sample chamber 10 under control of the controller 70.

The controller 70 causes the second transport rod 50 to move the cartridge 150 in the oblique direction C, followed by attachment of the cartridge 150 to the mounting portion 112. At this time, as shown in FIGS. 4 and 5, a rotary force is imparted to the cartridge 150 by the first resilient member 118a and the second resilient member 118b, thus pressing the opposing first tilted surface 154a and the opposing second tilted surface 154b against the first tilted surface 115a and the second tilted surface 115b, respectively. Consequently, a downward force acts on the cartridge 150. As a result, the cartridge 150 is pushed into intimate contact with the placement surface 114. This can reduce positional deviation of the cartridge 150 in the heightwise direction of the sample, i.e., along the optical system of the optical system of the electron microscope 1. Furthermore, the balls 119 secured to the second resilient member 118b fit in the holes 156 of the first tilted surface 115a, thus restricting movement of the cartridge 150.

The controller 70 returns the second transport rod 50 into the sample exchange chamber 20 and closes the partition valve 22. Because of the processing steps described so far, the cartridge 150 can be mounted to the mounting portion 112. Consequently, the sample held in the cartridge 150 can be observed with the electron microscope 1.

4.2.2. Detachment of Cartridge

In the electron microscope 1, the cartridge 150 can be automatically taken out from the mounting portion 112 and transported into the sample exchange chamber 20.

The partition valve 22 is opened and the second transport rod 50 is moved into the sample chamber 10. The cartridge 150 mounted to the mounting portion 112 is gripped by the second transport rod 50 and moved in a direction opposite to the oblique direction C, all under control of the controller 70. Consequently, the cartridge 150 is taken out from the mounting portion 112.

The cartridge 150 is transported into the sample exchange chamber 20 by the second transport rod 50 and then the partition valve 22 is closed. Then, the cartridge 150 is loaded by the second transport rod 50 into the magazine 4 gripped by the first transport rod 40, all under control of the controller 70. Because of the processing steps described so far, the cartridge 150 can be detached from the mounting portion 112.

4.3. Functions and Effects

The electron microscope 1 includes the sample holder 100 and so positional deviation of the cartridge 150 in the heightwise direction of the sample can be reduced. Consequently, in the electron microscope 1, the amount of defocus caused by deviation of the sample in the heightwise direction can be reduced.

5. Modified Embodiments

5.1. First Modified Embodiment

In the above embodiment, the rotary drive mechanism for imparting a rotary force to the cartridge 150 is made up of the first resilient member 118a and the second resilient member 118b. No restriction is placed on the structure of the rotary drive mechanism as long as it can impart a rotary force to the cartridge 150.

Figure 8:
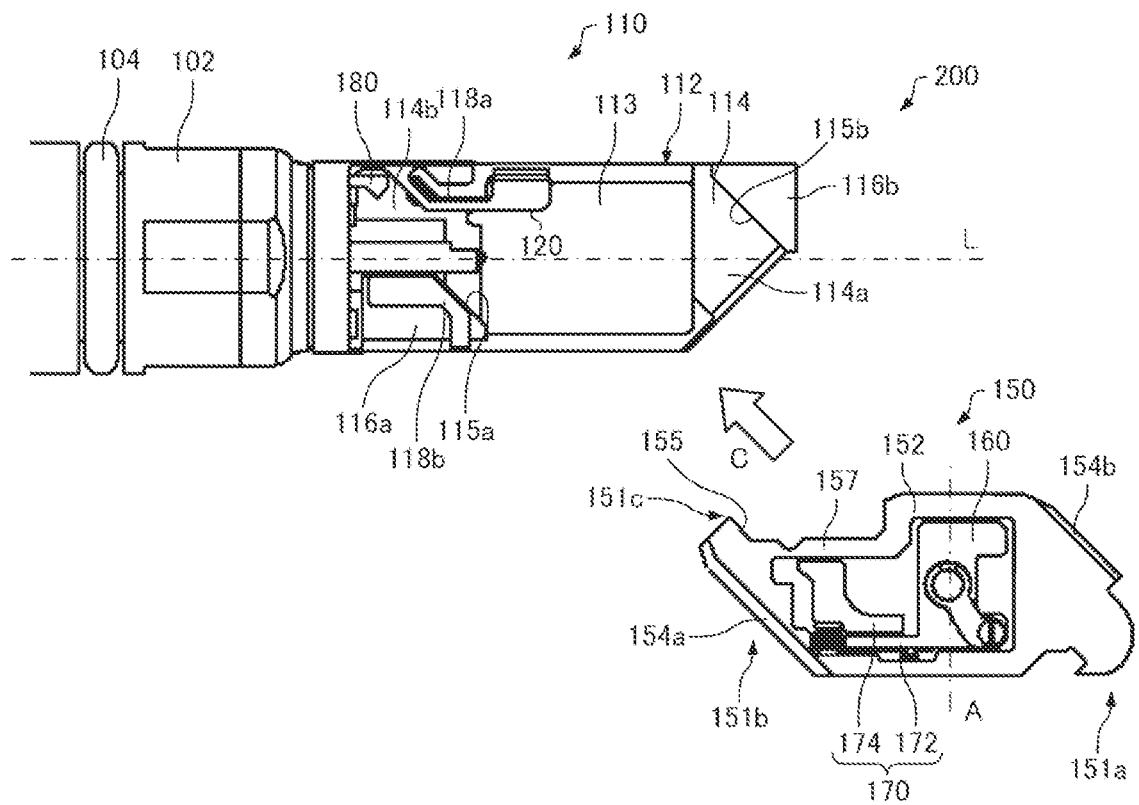
FIGS. 8 and 9 are schematic plan views of a sample holder associated with a first modified embodiment.
Figure 9:
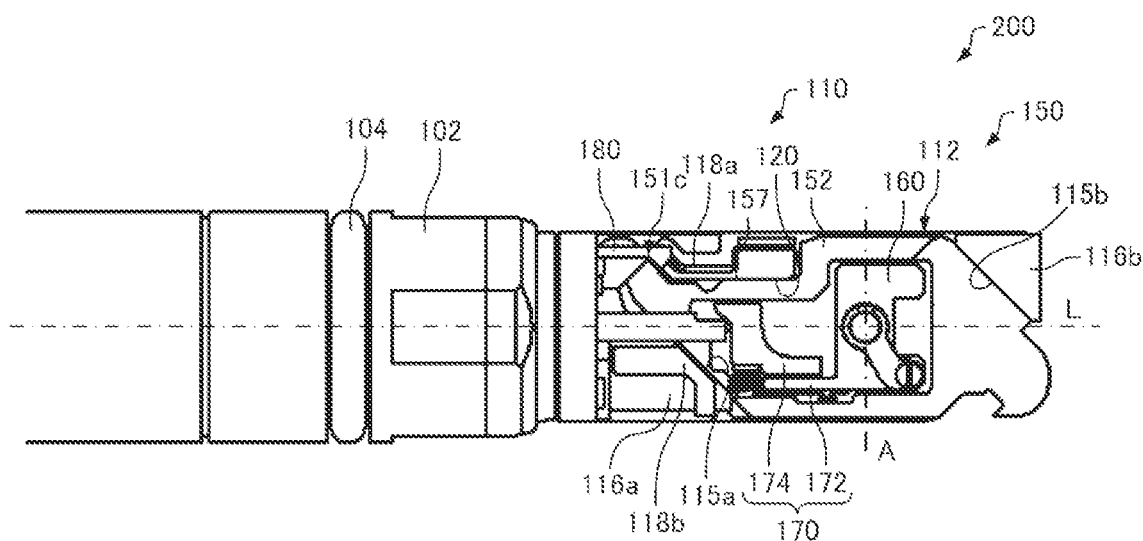

FIGS. 8 and 9 are schematic plan views of a sample holder, 200, associated with a first modified embodiment. FIG. 8 shows a state in which the cartridge 150 has been detached from the mounting portion 112 of the holder base 110. FIG. 9 shows a state in which the cartridge 150 has been mounted to the mounting portion 112 of the holder base 110. Those members of this sample holder 200 which are similar in function to their respective counterparts of the above-described sample holder 100 are indicated by the same reference numerals as in the previous figures and a detailed description thereof is omitted.

As shown in FIGS. 8 and 9, the rotary drive mechanism may include an arm 180 for gripping a protrusion 151c on the rear end portion 151b of the cartridge 150 and a drive source such as an electric motor for driving the arm 180. The arm 180 is attached to the shaft portion 102 and has a hooked front end capable of gripping the protrusion 151c on the cartridge 150. The arm 180 is moved along the central axis L by operation of the drive source.

The protrusion 151c is mounted off the central axis L of the cartridge 150. A rotary force can be imparted to the cartridge 150 by gripping the protrusion 151c by means of the arm 180 and pulling the arm 180 using the drive source.

Where the protrusion 151c on the cartridge 150 is pulled by the arm 180, the second block 116b may be dispensed with, in which case if the cartridge 150 moves in the oblique direction C, an abutting surface 157 of the cartridge 150 is pushed against an abutting surface 120 of the mounting portion 112. The arm 180 grips the protrusion 151c, and the arm 180 is pulled in by the drive source such as an electric motor. This produces a rotary force on the cartridge 150, pressing the opposing first tilted surface 154a against the first tilted surface 115a. The cartridge 150 is pushed against the placement surface 114 (second region 114b).

In this way, in the sample holder 200, a rotary force is imparted to the cartridge 150 by the drive source such as an electric motor. Therefore, a greater rotary force can be applied to the cartridge 150, for example, than where the pushback force from a resilient member is used to impart a rotary force to the cartridge 150. Consequently, in the sample holder 200, for example, the second block 116b (second tilted surface 115b) may be dispensed with.

5.2. Second Modified Embodiment

In the foregoing embodiment, the charged particle beam system associated with the present invention has been described in which an electron microscope for observing or analyzing a sample using an electron beam is taken as an example. The charged particle beam system associated with the present invention may also be an instrument for making an observation or analysis of a sample using a charged particle beam other than an electron beam such as an ion beam. For example, the charged particle beam system associated with the present invention may be a scanning transmission electron microscope, a scanning electron microscope, an Auger electron spectrometer, a focused ion beam system, or the like.

It is to be understood that the present invention is not restricted to the above embodiment and modifications thereof and that the invention can be practiced in further modified forms. For example, the present invention embraces configurations substantially identical (e.g., in function, method and results or in purpose and advantageous effects) to the configurations described in the above embodiment. Furthermore, the present invention embraces configurations similar to the configurations described in the above embodiment except that nonessential portions have been replaced. In addition, the present invention embraces configurations identical in advantageous effects or purpose to the configurations described in the above embodiment. Further, the present invention embraces configurations similar to the configurations described in the above embodiment except that a well-known technique is added.

What is claimed is:

1. A sample holder for use in a charged particle beam system, said sample holder comprising:
   a cartridge for holding a sample therein; and
   a holder base having a mounting portion to which the cartridge can be detachably mounted;
   wherein said mounting portion of the holder base comprises: a cartridge placement surface on which the cartridge is placed; a first tilted surface; and a rotary drive mechanism for imparting a rotary force to the cartridge which has an opposing first tilted surface opposite to said first tilted surface of the mounting portion of the holder base; and
   wherein the rotary drive mechanism imparts the rotary force to the cartridge to thereby push the opposing first tilted surface of the cartridge against the first tilted surface of the mounting portion, thus pressing the cartridge against the cartridge placement surface of the mounting portion of the holder base.

2. The sample holder as set forth in claim 1, wherein
   said mounting portion of the holder base comprises a second tilted surface,
   said cartridge is disposed between said first tilted surface and said second tilted surface of the mounting portion and further comprises an opposing second tilted surface opposite to the second tilted surface of the mounting portion, and
   said rotary drive mechanism imparts the rotary force to the cartridge such that said opposing first tilted surface and said opposing second tilted surface of the cartridge are pushed against the first tilted surface and the second tilted surface, respectively, of the mounting portion, whereby the cartridge is pressed against the cartridge placement surface of the mounting portion.

3. The sample holder as set forth in claim 2, wherein said mounting portion of the holder base comprises a block which is provided with said second tilted surface and which is located at the front end of the mounting portion.

4. The sample holder as set forth in claim 1, wherein said rotary drive mechanism imparts the rotary force to said cartridge, whereby a rotary force acting about an axis of rotation parallel to a line normal to said cartridge placement surface of the mounting portion is produced on the cartridge.

5. The sample holder as set forth in claim 1, wherein said rotary drive mechanism comprises a resilient member against which said cartridge is pressed, whereby the rotary force is imparted to the cartridge.

6. The sample holder as set forth in claim 5, wherein balls are secured to said resilient member, and wherein said first tilted surface of the mounting portion is provided with holes in which the ball fit, whereby movement of the cartridge is restricted.

7. The sample holder as set forth in claim 1, wherein said cartridge placement surface of the mounting portion has a first region providing support of a front end portion of said cartridge and a second region providing support of a rear end portion of the cartridge.

8. A charged particle beam system comprising a sample holder set forth in claim 1.

9. The charged particle beam system as set forth in claim 8, further comprising:
   a sample chamber in which said mounting portion of said sample holder is disposed;
   a sample exchange chamber connected to the sample chamber; and
   a transport rod for transporting said cartridge between the sample chamber and the sample exchange chamber.

* * * * *